United States Patent [19]

Nuyen

[11] Patent Number: 5,510,635
[45] Date of Patent: Apr. 23, 1996

[54] INTEGRATED CIRCUIT HAVING COMPLEMENTARY HETEROJUNCTION FIELD EFFECT TRANSISTORS

[75] Inventor: Linh T. Nuyen, Paris, France

[73] Assignee: Picogiga Societe Anonyme, Les Ulis, France

[21] Appl. No.: 162,175

[22] PCT Filed: Apr. 15, 1993

[86] PCT No.: PCT/FR93/00376

§ 371 Date: Feb. 14, 1994

§ 102(e) Date: Feb. 14, 1994

[87] PCT Pub. No.: WO93/21658

PCT Pub. Date: Oct. 28, 1993

[30] Foreign Application Priority Data

Apr. 15, 1992 [FR] France ................................ 92 04635
Jan. 21, 1993 [FR] France ................................ 93 00605

[51] Int. Cl.$^6$ ................................................ H01L 29/778
[52] U.S. Cl. ........................................... 257/195; 257/194
[58] Field of Search ...................................... 257/194, 195

[56] References Cited

FOREIGN PATENT DOCUMENTS

| 0256363 | 2/1988 | European Pat. Off. . | |
|---|---|---|---|
| 0397148 | 11/1990 | European Pat. Off. . | |
| 0519830 | 12/1992 | European Pat. Off. . | |
| 2566185 | 12/1985 | France | 257/195 |
| 61-99379 | 5/1986 | Japan | 257/195 |
| 62-165577 | 1/1987 | Japan | 257/195 |

OTHER PUBLICATIONS

Kanji Yoh et al, "A p—channel GaSb heterojunction field—effect transistor based on a vertically . . . " Proceedings of the 18th Int'l Symposium on Gallium Arsenide & Related Compounds, Sep. 1991, pp. 173–178.

A. I. Akinwande et al., "Complementary III—V Heterostructure FETs for Low Power Integrated Circuits" Int'l Electron Devices Mtg., Dec. 1990, pp. 983–986.

S. R. Bahl et al., "Breakdown Voltage Enhancement from Channel Quantization in InAlAs/n+—InGaAs HFET's", IEEE Electron Device Letters, vol. 13, No. 2, Feb. 1992, pp. 123–125.

Y—J Chan et al., "InAlAs/InxGa12—xAs HIGFET's (x>= 0.53) for E/D FET Logic Applications", 3rd Int'l Conf. on Indium Phosphide & Related Materials, Apr. 1991, pp. 242–245.

S. Loualiche et al., "Influence of the Well Composition & Thickness in the GaInP/InP/GaInAs/InP Structure for HEMT", 3rd Int'l Conf. on Indium Phosphide & Related Materials, Apr. 1991, pp. 434–437.

Primary Examiner—Jerome Jackson, Jr.
Attorney, Agent, or Firm—Jacobson, Price, Holman & Stern

[57] ABSTRACT

The circuit comprises a heterojunction formed between a layer (6) comprising an III–V semiconductor material having a wide forbidden band and a layer (5) comprising an III–V semiconductor material having a narrow forbidden band and whose crystal lattice mismatch with the remainder of the structure is such that the layer comprising the narrow forbidden band material is under uniaxial compression strain in the plane of the layer.

According to the invention the thickness of the layer (6) comprising the wide forbidden band material is selected to be smaller for the p-channel transistor than for the n-channel transistor, the ratio of these respective thicknesses being a predetermined ratio that is a function of the relative tunnel transparency for holes compared with that for electrons.

22 Claims, 4 Drawing Sheets

FIG_1
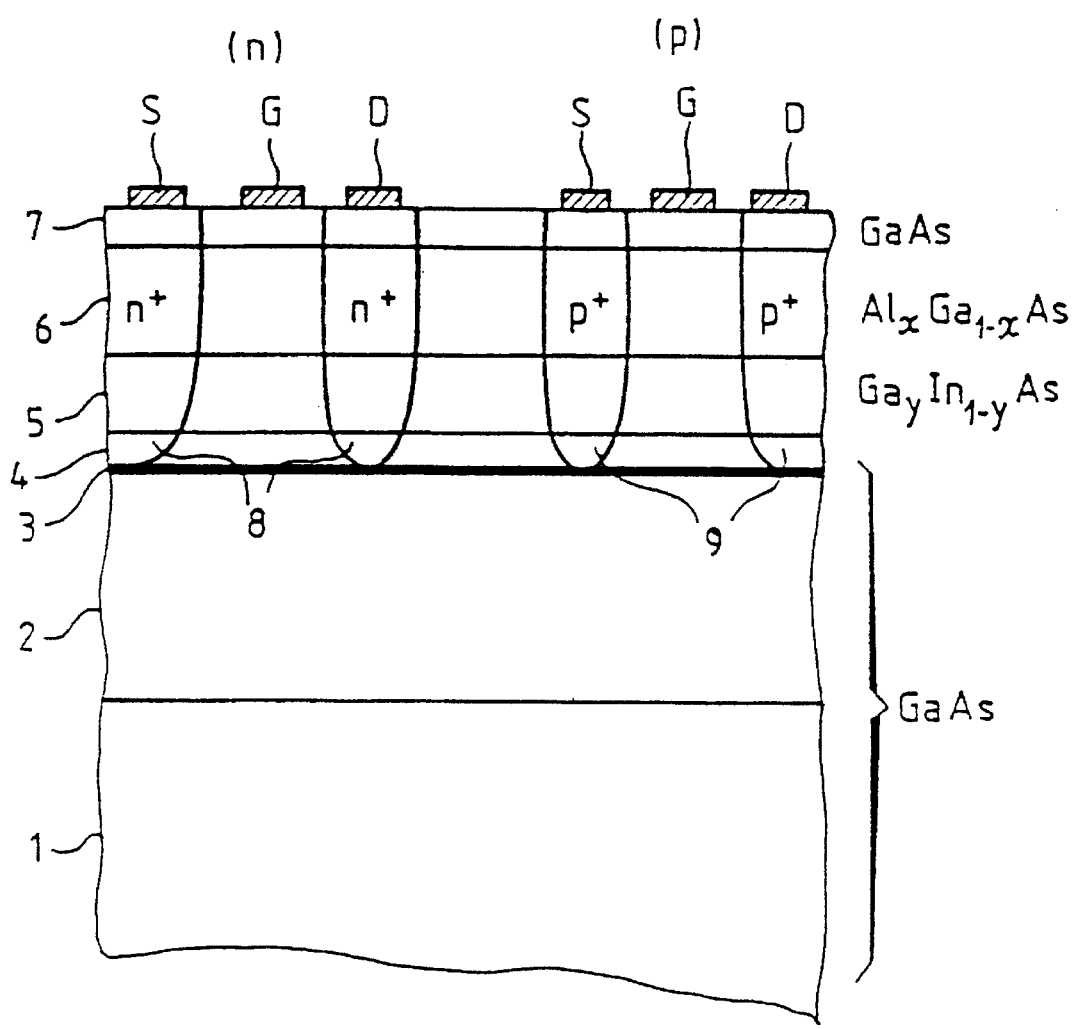

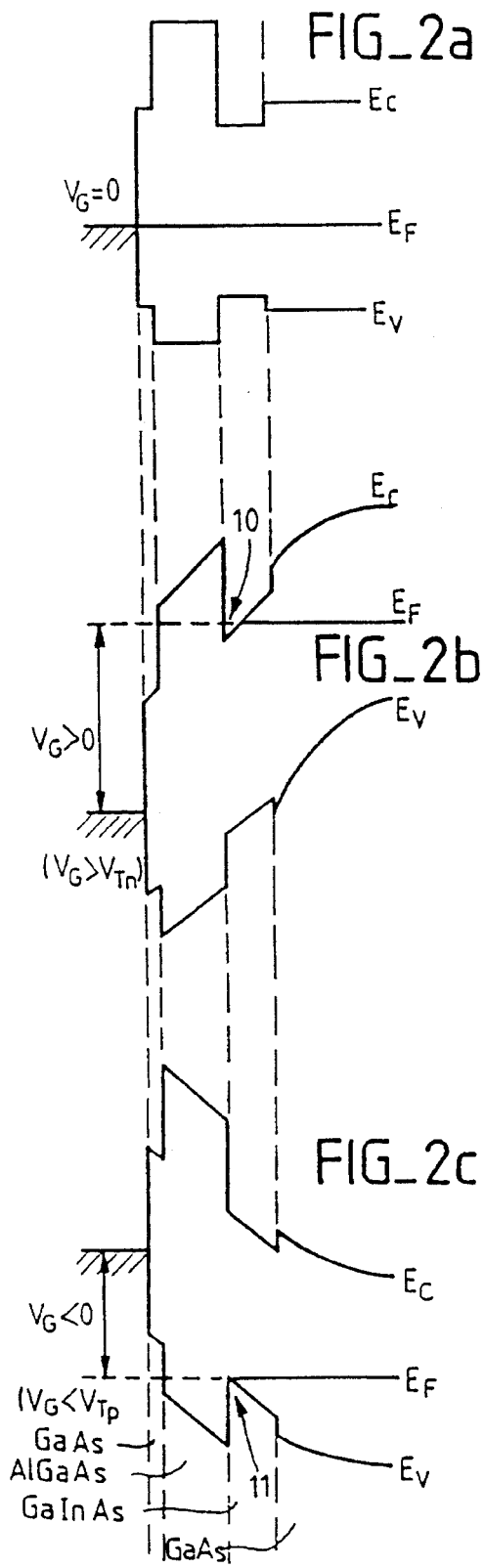
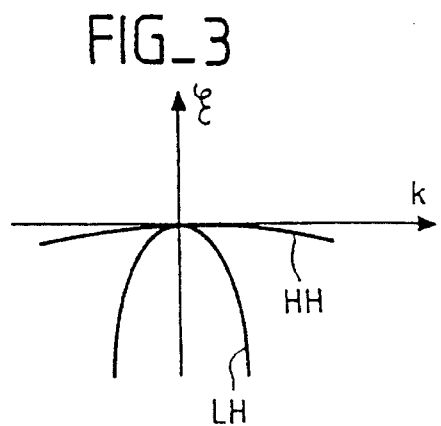
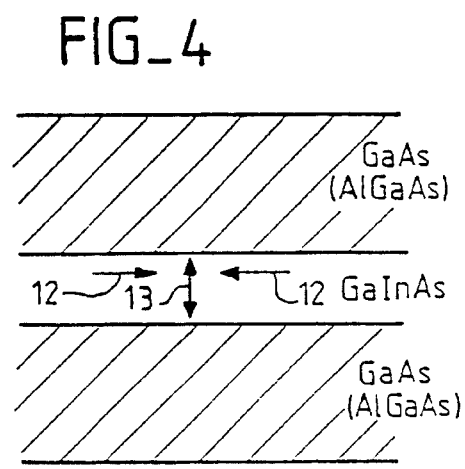
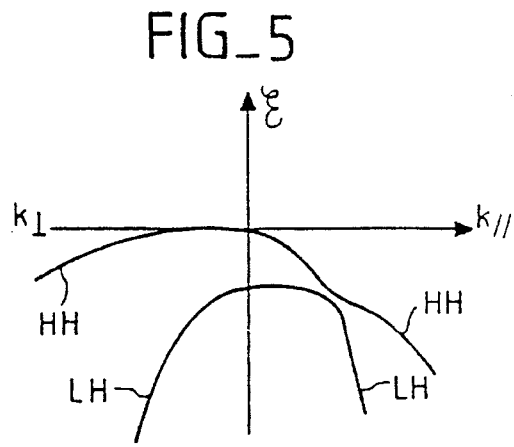

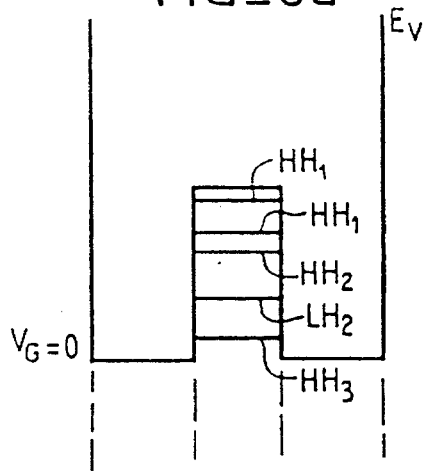
FIG_6a
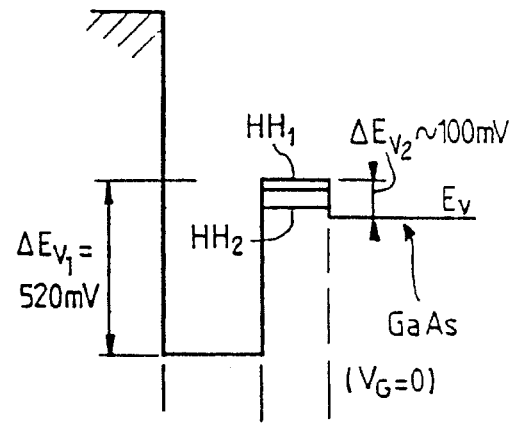
FIG_7a
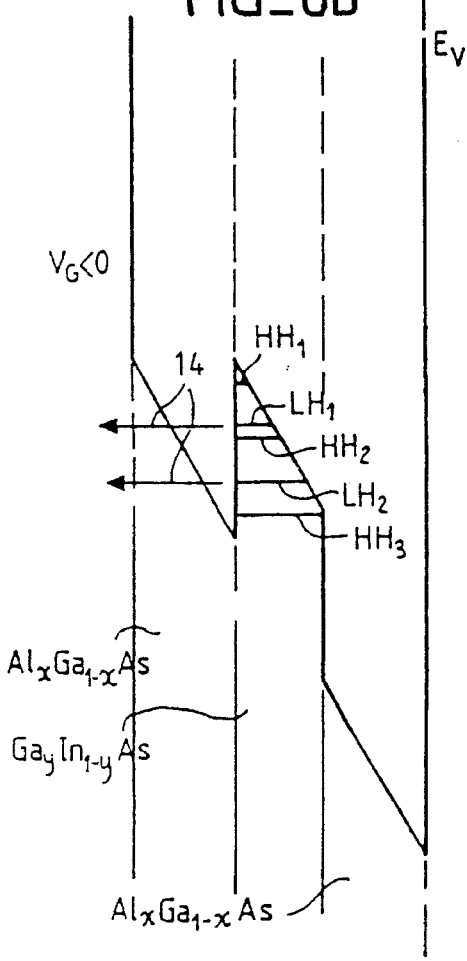
FIG_6b
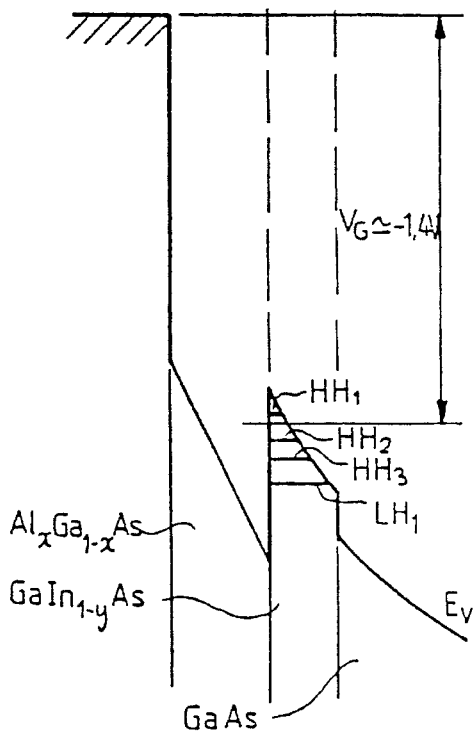
FIG_7b

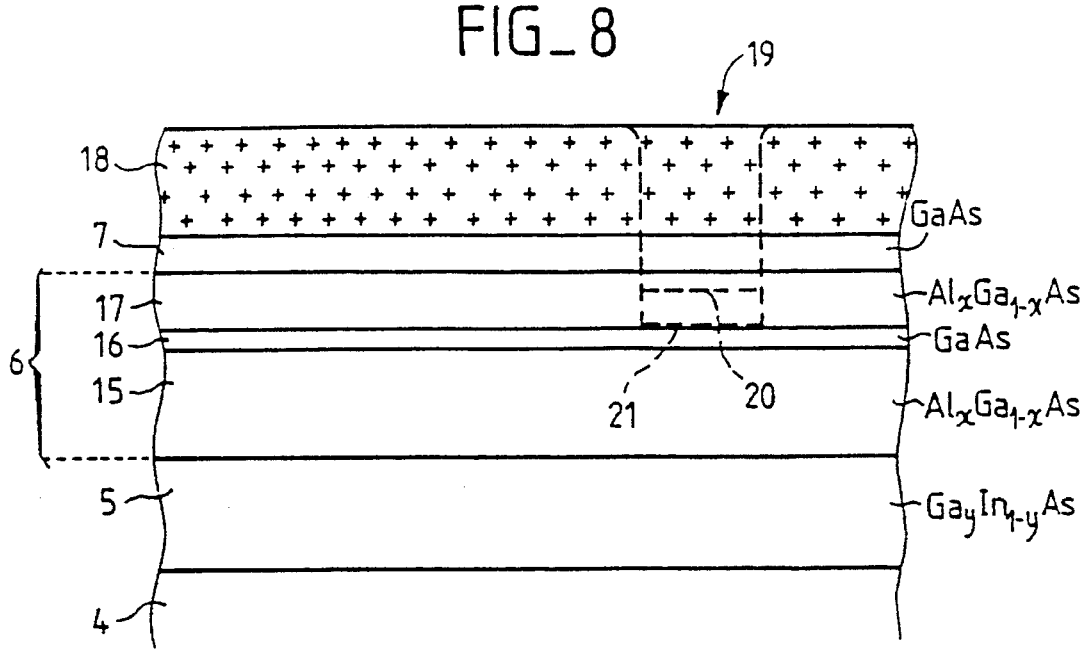
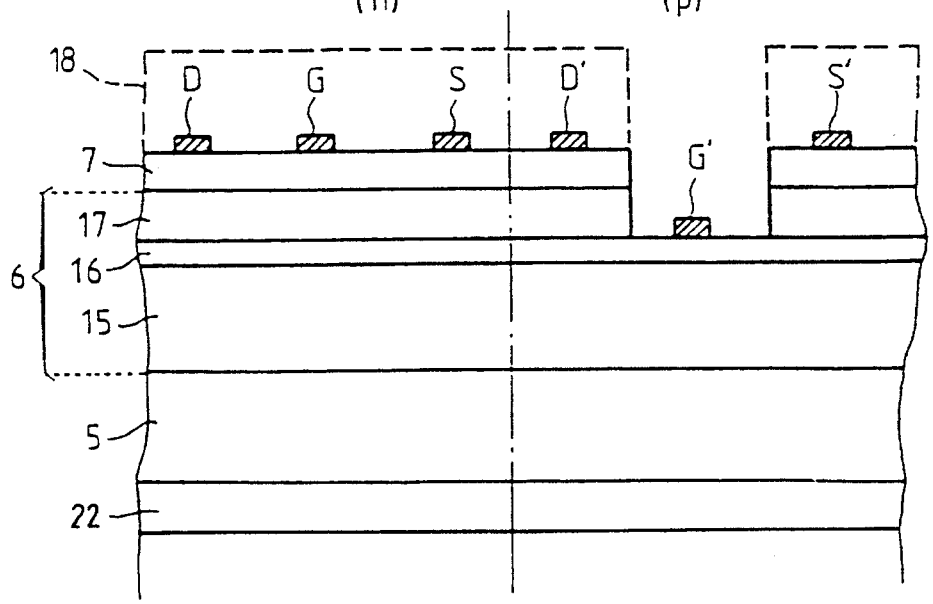

INTEGRATED CIRCUIT HAVING COMPLEMENTARY HETEROJUNCTION FIELD EFFECT TRANSISTORS

The invention relates to integrated circuits having complementary p-channel and n-channel field effect transistors.

Integrated circuits using complementary AlGaAs/GaAs heterojunction transistors (also called HIGFETs for "Heterojunction Insulated-Gate Field-Effect Transistors") are described by D .E. Grider et al. in Delta-Doped Complementary Heterostructure FETs with High Y-Value Pseudomorphic $In_yGa_{1-y}$ As Channels for Ultra-Low Power Digital IC Applications, *IEDM Digest* 1991, p. 235. In their work, D. E. Grider et al. have made 4-Kbit static random access memories (SRAM) having low electrical power consumption. More recently, they have improved their technology so as to further reduce the electrical power consumption of their integrated circuit (G. S. LaRue and D. E. Grider, Complementary HFET 32-bit Serial Multiplier, *GaAs IC Symposium 92 Digest*, p. 89).

The invention relates to that type of AlGaAs/GaInAs heterojunction type of component, and it seeks to mitigate a certain number of imperfections and limitations (explained in greater detail below) of known components that have already been proposed.

More precisely, an object of the present invention is to propose a suitable choice of thicknesses and of compositions for the epitaxial layers of such structures enabling complementary circuits to be implemented having very low electrical power consumption, while simultaneously increasing the transconductance of the p-channel transistor. That has not been possible until now because although an improvement in circuit power consumption has been achieved, there has been no improvement in the transconductance of the p-channel transistor. The reasons for these improvements are explained in detail below.

To this end, the component of the invention which is of the type comprising an integrated circuit having complementary components of the p-channel and n-channel field effect transistor type, with a heterojunction formed between a layer comprising an III–V semiconductor material having a wide forbidden band and a layer comprising an III–V semiconductor material having a narrow forbidden band and whose crystal lattice mismatch with the remainder of the structure is such that the layer comprising the narrow forbidden band material is under uniaxial compression strain in the plane of the layer, is characterized in that the thickness of the layer comprising the wide forbidden band material is selected to be smaller for the p-channel transistor than for the n-channel transistor, the ratio of these respective thicknesses being a predetermined ratio that is a function of the tunneling probability for holes compared with that for electrons.

In a first aspect of the invention, the heterojunction defines a quantum well including HH and LH type subbands in the valence band diagram of the heterostructure in the level that comprises the narrow forbidden band material, and the composition of the narrow forbidden band material is selected so that the energy differences between the subbands $HH_1$, $HH_2$ and $LH_1$ is such that the population of the $LH_1$ sub-band is essentially negligible and the gate leakage current of the p-channel transistor is essentially dependent of the low tunnel probability heavy holes $HH_1$ and $HH_2$.

In a second aspect of the invention, the thickness of the layer comprising the wide forbidden band material that is selected to be thinner for the p-channel transistor than for the n-channel transistor is further selected to as to reduce the absolute values of the threshold voltages of said transistors, thereby reducing the electrical power consumption of the circuit while increasing the transconductance of the p-channel transistor.

According to various advantageous characteristics or embodiments:

The material having a wide forbidden band is $Al_xGa_{1-x}As$ or $(Al_xGa_{1-x})_uIn_{1-u}P$ and the material having the narrow forbidden band is $Ga_yIn_{1-y}As$, said materials being grown epitaxially on a GaAs substrate.

The material having a wide forbidden band is $Al_zIn_{1-z}As$ or InP and the material having a narrow forbidden band is $Ga_yIn_{1-y}As$, said materials being grown epitaxially on an InP substrate.

The layer comprising the wide forbidden band material includes an epitaxial stack comprising: a first elementary layer comprising the wide forbidden band material; an optional second elementary layer, different in composition from the first elementary layer, and suitable for facilitating selective etching thereof; and a third elementary layer comprising the wide forbidden band material; the thicknesses of the first and third elementary layers are selected in such a manner that the ratio of the thickness of the first elementary layer to the total thickness of the first and third elementary layers is equal to said predetermined ratio; and the gate of the p-channel transistor is disposed in such a manner as to provide contact with the second elementary layer.

Under such circumstances, and in the context of the above-mentioned second aspect, the threshold voltages of the transistor, in absolute value terms, may be less than 0.5 V, and the transconductance of the p-channel transistor may be improved by a factor of more than 1.25 relative to that of a p-channel having its gate deposited on the layer comprising the material having a wide forbidden band.

In which case, the composition of the first elementary layer is selected to be different from the composition of the third elementary layer in such a manner that the potential barrier $\Delta E_v$ corresponding to the discontinuity in the valence band between the materials of the first elementary layer and of the layer comprising the narrow forbidden band material and which determines the tunneling probability for holes, is selected independently of the potential barrier $\Delta E_c$ corresponding to the conduction band discontinuity between the materials of the third elementary layer and of the layer comprising the narrow forbidden band material and which determines tunneling probability for electrons, thereby reducing the thickness of the first elementary layer and consequently reducing the threshold voltages of the transistors to values of less than about 0.4 V, and increasing the transconductance of the p-channel transistor relative to the case where the first and third elementary layers are identical.

The following preferred choices of materials may then be implemented, with the material being grown in each case by epitaxy on a GaAs substrate: first elementary layer in AlAs and third elementary layer of $Al_xGa_{1-x}As$, with $0.5 \leq x_{Al} \leq 0.75$; first elementary layer of AlAs and third elementary layer of $Al_uIn_{1-u}P$ with $u_{Al} \approx 0.50$; first elementary layer of $Al_uIn_{1-u}P$ with $u_{Al} \approx 0.50$ and third elementary layer of $Al_xGa_{1-x}As$ with $0.5 \leq x_{Al} \leq 0.75$; first elementary layer of $Al_uIn_{1-u}P$ with $u_{Al} \approx 0.50$ and third elementary layer of $GaP_sSb_{1-s}$ with $s_p \approx 0.65$; and with epitaxial growth on a substrate of InP: first elementary layer of InP and third elementary layer of $Al_zIn_{1-z}As$, with $z_{Al} \approx 0.48$; first elementary layer of InP and third elementary layer of $GaP_{s'}Sb_{1-s'}$, with $s'_p = 0.35$.

The second elementary layer may be absent and the selectivity of selective etching of the first elementary layer is then ensured by the difference in chemical composition between the first elementary layer and the third elementary layer.

The doping is doping that is not uniform over the entire circuit, said doping being obtained by impurities that are locally implanted in the n-channel and in the p-channel transistors at different implantation concentrations, with the concentration that corresponds to p-channel transistors being optionally equal to zero.

An additional layer is interposed between the buffer layer and the layer comprising the narrow forbidden band material, the material of the additional layer presenting, relative to the layer comprising the narrow forbidden band material, a valence band discontinuity that is not less than about 100 meV.

The invention is described in detail below with reference to the accompanying figures; it will be observed that in all the figures the references always designate identical elements.

FIG. 1 shows the general starting structure of the invention having two transistors, respectively an n-channel transistor and a p-channel transistor.

FIGS. 2a, 2b, and 2c show the appearance of the conduction band and of the valence band for the structure of FIG. 1, respectively while at rest, while a positive gate voltage is being applied to the n-channel transistor, and while a negative gate voltage is being applied to the p-channel transistor.

FIG. 3 is a plot of energy as a function of wave vector showing the valence band of GaAs and of GaInAs for a material that is not under strain.

FIG. 4 is a diagram of the structure of a strained heterojunction and it shows the nature of the strains to which it is subject.

FIG. 5 is analogous to FIG. 3 but applicable to the strained material of FIG. 4.

FIGS. 6a and 6b how the appearance of the valence band respectively at rest and while a negative gate voltage is being applied for a strained $Al_xGa_{1-x}As/Ga_yIn_{1-y}As/Al_xGa_{1-x}As$ structure of the type shown in FIG. 4.

FIGS. 7a and 7b are similar to FIGS. 6a and 6b for a non-symmetrical quantum well corresponding to a strained $Al_xGa_{1-x}As/Ga_yIn_{1-y}As/GaAs$ structure.

FIG. 8 shows the stack of layers enabling a component of the invention to be made, while in its initial state prior to being etched.

FIG. 9 shows the same structure after etching, with a pair of complementary n-channel and p-channel transistors.

FIG. 1 is a diagram showing the basic structure which is known per se and from which the invention is derived. This structure comprises in succession:

- a substrate 1 of GaAs;
- a buffer layer 2, likewise of GaAs or else constituted by a GaAs/AlGaAs stack, but having thoroughly controlled crystallographic and chemical (purity) characteristics, extending over a thickness of 500 nm (with this thickness value like all the others that follow constituting a typical value given solely as an indication, unless specified otherwise);
- bulk or planar silicon doping 3 ("δ-doping");
- a layer 4 of GaAs having a thickness of about 3 nm;
- a layer 5 of $Ga_yIn_{1-y}As$, that is 4 nm to 15 nm thick, and that has a gallium content $Y_{Ga}$ of the order of about 0.75 to about 0.80 (here, as below, all contents are given in terms of molar fractions);
- a layer 6 of $Al_xGa_{1-x}As$ that is 25 nm thick, and that has an aluminum content $x_{Al}$ of the order of about 0.75; and
- a protective layer 7 of GaAs, that is 3 nm thick.

Incidentally, it will be observed that III–V alloys other than those specified can be used, for example a layer 6 of $Ga_uIn_{1-u}P$ or of $(Al, Ga) In_{1-u}P$ having a crystal lattice constant that is matched to GaAs, or else $Al_zIn_{1-z}As$ on a layer 5 of GaInAs having a crystal lattice constant matched to InP.

In addition, except for the doping 3, all of the layers forming this starting structure are non-doped layers.

n-channel and p-channel field effect transistors can be formed on this structure by implanting respective nHu +and p⁺zones of doping referenced 8 and 9 that penetrate down to the layer 3, and by forming source, drain, and gate electrodes S, D, and G on the surface in a manner that is entirely conventional.

It is thus possible to make logic circuits that have complementary n-channel and p-channel transistors. For an n-channel transistor, if a highly positive voltage is applied to its gate, i.e. a voltage greater than a threshold $V_{Tn}$, then electrons will accumulate in the layer 5 of $Ga_yIn_{1-y}As$, thus forming an n-type channel. Conversely, for a p-channel transistor, if a highly negative voltage is applied to its gate, i.e. a voltage lower than a threshold voltage $V_{Tp}$, holes will accumulate in the layer 5 of $Ga_yIn_{1-y}As$, thus forming a p-type channel.

FUNDAMENTAL PRINCIPLES OF THE INVENTION

In such structures, the threshold voltages $V_{Tn}$ and $V_{Tp}$ are given by the following equations:

$$V_{Tn}=\Phi_{Bn}-\Delta E_c-A'.Q.d-c \qquad (1)$$

$$V_{Tp}=-\Phi_{Bp}-\Delta E_v-A'.Q.d+c$$

$\Phi_{Bn}$ and $\Phi_{Bp}$ designate the heights of the Schottky barriers relative to electrons and to holes, respectively;

$\Delta E_c$ and $\Delta E_v$ designate the discontinuity of the conduction band and of the valence band respectively between $Al_xGa_{1-x}As$ and $Ga_yIn_{1-y}As$;

A' is a constant;

Q is the charge of the doping 3;

d is the distance between the Schottky gate and the layer 5; and c is a constant depending on the geometry of the transistor.

In such structures, the threshold voltages $V_{Tn}$ and $V_{Tp}$ thus depend both on the concentration of dopant and on the total thickness of the layers 6 and 7, and their values are related by the equation:

$$V_{Tn}-V_{Tp}=E_g(Ga_yIn_{1-y}As) \qquad (2)$$

where $E_g(Ga_yIn_{1-y}As)$ designates the width of the forbidden band of the layer 5 of $Ga_yIn_{1-y}As$.

For reasons of symmetry, for a given thickness of the layers 5 and 6, the doping levels are often adjusted so that:

$$V_{Tn}=|V_{Tp}|\approx 0.55 \text{ V}$$

Although said value is quite acceptable for making complementary integrated circuits, it is known that it nevertheless leads to high electrical power consumption since such electrical power consumption increases directly with said voltage. It is therefore highly desirable to reduce the threshold voltages to values close to 0.3 V or even less if such values can be achieved.

With complementary metal-oxide semiconductor (CMOS) technology, as with silicon technology, the threshold voltages of n-channel and p-channel transistors are controlled independently by adjusting the concentration of dopant for each type of transistor. Such adjustment is easily performed by using appropriate concentrations when implanting impurities independently in the n-channel and in the p-channel. This solution may also be used with a HIGFET, as shown by G. S. LaRue and D .E. Grider in Complementary HFET 32-Bit Serial Multiplier, *GaAs IC Symposium* 1992 *Digest*, p. 89.

This solution, which enables $V_{Tn}$ and $V_{Tp}$ to be reduced independently, and which therefore enables the electrical power consumption of the integrated circuit to be reduced, has no effect on the transconductance of the p-channel transistor. Unfortunately, it is known that said transconductance is relatively low.

First Embodiment of the Invention

In a first embodiment of the invention, it is possible to provide a solution that improves the transconductance of the p-channel transistor (said first solution nevertheless having little effect on the threshold voltages $V_{Tn}$ and $V_{Tp}$).

For the FIG. 1 structure described above, FIGS. 2a, 2b, and 2c show the corresponding configuration of the conduction band $E_c$ and of the valence band $E_v$, respectively at rest, with a positive gate voltage (thus corresponding to an n-channel transistor), and with a negative gate voltage (thus corresponding to a p-channel transistor). $V_G$ represents the applied gate voltage (zero, positive, or negative, as appropriate), and $E_F$ represents the Fermi level. Reference 10 specifies the location at which electrons accumulate in an n-channel transistor while reference 11 indicates the location at which holes accumulate in a p-channel transistor.

It will be shown that the respective conduction conditions applicable to holes and to electrons are very different, which, in structures that have been made in the past, gives rise to a very large mismatch between the properties of n-channel transistors and the properties of p-channel transistors integrated in the same circuit.

In GaAs or GaInAs it is known that electrons have a low effective mass $m^*_e$, whereas holes have a high effective mass $m^*_h$ (it being recalled that "effective" mass corresponds to a statistical mean); in other words, the mobility of electrons is high whereas the mobility of holes is low.

To remedy this drawback that prevents high-speed complementary logic circuits being fabricated, proposals have been made by G. C. Osbourn et al. in Electron and Hole Effective Masses for Two-Dimensional Transport in Strained-Layer Superlattices, *Superlattices and Microstructures*, Vol. 1, No. 3, p. 223 (1985), to associate GaInAs with GaAs or AlGaAs in order to establish a strained layer of GaInAs which has the effect of reducing the effective mass of holes by means of physical phenomena that are complex and that are explained briefly below.

In an unstrained material, the valence band of GaAs or GaInAs is split into two bands of quite clearly separate curvatures. FIG. 3 is a graph in the $\{\xi, \kappa\}$ plane (energy as a function of wave vector) showing the valence band in this case: one of the bands, referenced HH is called the "heavy hole band" while the other band referenced LH is called the "light hole" band. It is known that the effective mass of holes is inversely proportional to the curvature of the band, as given by the following equation:

$$m^*_h = \hbar^2/(\partial^2 \xi/\partial \kappa^2) \tag{3}$$

where $\hbar$ is Planck's constant, $\xi$ is energy and $\kappa$ is the wave vector.

If a strained material is now considered, e.g. a thin layer of GaInAs sandwiched between two layers of GaAs or of AlGaAs (as shown in FIG. 4), the GaInAs layer is subjected to compression in the plane parallel to the interface as represented by arrows 12, whereas the same layer is subjected to tension in the perpendicular plane as represented by arrow 13.

In the corresponding valence band diagram, shown in FIG. 5, the effect of the above deformations is to separate the valence bands and to deform them considerably in the plane parallel to the interface.

In FIG. 5, the righthand half-plane corresponds to the wave vector $\kappa_f$ parallel to the interface while the lefthand half-plane shows the wave vector $\kappa\perp$ perpendicular to the interface. Parallel to the interface (i.e. for the right hand half-plane in the diagram of FIG.5), the bands are highly deformed, with "heavy" holes HH becoming light and conversely with "light" holes LH becoming heavy, whereas perpendicularly to the interface (i.e. in the lefthand halfplane of FIG. 5), "heavy" holes HH remain heavy and "light" holes LH remain light. In other words, the light/heavy character of holes has been swapped over in one of the valence bands but not in the other.

The deformation of these valence bands also changes the statistical distribution of the hole populations: thus, on average, in a GaAs/GaInAs/GaAs system or in an AlGaAs/GaInAs/AlGaAs system the effective mass of the holes is less than in a non-strained GaAs/AlGaAs system. Thus, in such a strained system p-channel transistors present increased mobility, and as a result better transconductance $g_{mp}$. The above-mentioned work of Grider thus mentions transconductances $g_{mp}$ reaching 70 mS/mm (millisiemens per millimeter) for transistors having a gate of length 1 μm. Nevertheless, that value is much lower than the corresponding values $g_{mn}$ of the transconductances of n-channel transistors which are of the order of 300 mS/mm, giving a ratio of 4.3 that still needs to be overcome if it is desired that the p-channel transistor should operate as well as the n-channel transistor.

The invention seeks to overcome this limitation by combining the various physical effects that take place in the thin layer 5 of $Ga_yIn_{1-y}As$ (effect of mechanical strain on the band diagram, quantum effect on the energy position of the holes) and on the physical effects that place in the layer 6 of $Al_xGa_{1-x}As$ (tunnel effect), so as to increase the transconductance of the p-channel transistor and thus enable it to operate with higher performance.

Initially we consider these physical effects in a symmetrical structure comprising a layer 4 of $Al_xGa_{1-x}As$ (instead of GaAs), a layer 5 of $Ga_yIn_{1-y}As$, and a layer 6 of $Al_xGa_{1-x}As$; subsequently we consider the case where the layer 4 is a layer of GaAs.

It has been shown, in particular as described in French patent application 91-15140 in the name of the Applicant, that the tunneling effect of electrons through the layer 6 of $Al_xGa_{1-x}As$ needs to be minimized in order to reduce gate leakage current.

FIGS. 6a and 6b show the appearance of the valence band $E_v$ of said $Al_xGa_{1-x}As/Ga_yIn_{1-y}As/Al Ga_1 As$ stack of layers (layers 4, 5, and 6) respectively at equilibrium and under negative gate bias. Potential barriers correspond to the layers of $Al_xGa_{1-x}As$, whereas a quantum well corresponds to the layer of $Ga_yIn_{1-y}As$. Within this quantum well, there appear sub-bands $HH_1$, $HH_2$, $HH_3$, ..., and $LH_1$, $LH_2$, ..., respectively occupied by "heavy" holes and by "light" holes, i.e. holes that would be respectively heavy or light in $Ga_yIn_{1-y}As$ in the non-strained state. As mentioned above, these terms do not prejudice the genuinely heavy or light character of the holes since that property depends on the direction (parallel or perpendicular to the plane of the layers) in which hole motion is considered.

In the context of the invention, the only motion that is of interest is perpendicular to the plane of the layers, i.e. the effect of holes tunneling through the barrier constituted by the layer 6 of $Al_xGa_{1-x}As$. The effective mass of holes in this direction is written $m^*_{hL}$.

It has been shown by P. Ruden et al., in Quantum Well p-Channel AlGaAs/InGaAs/GaAs Heterostructure Insulated-Gate Field-Effect Transistors, *IEEE Transactions on Electron Devices*, Vol. 36, No. 11, p. 2371 (1989) that LH holes have an effective mass $m^*_{hL}$ of the order of 0.07 $m_O$, where $m_O$ is the electron mass. Such a value which is very close to the corresponding value for electrons in $Ga_yIn_{1-y}As$, is about 5.5 times smaller than the value corresponding to HH holes.

Under high negative gate bias, the hole tunnel effect takes place essentially only with LH holes, given that tunneling probability T increases with decreasing effective mass, in accordance with the following equation:

$$T = A \exp\{-[(m^{*1/2} \Delta E^{3/2} d)]/V\} \quad (4)$$

A being a constant;

$m^*$ being the effective mass of electrons or of holes, as appropriate;

$\Delta E$ being the height of the potential barrier;

V being the applied voltage; and d being the thickness of the layer 6 of $Al_xGa_{1-x}As$.

FIG. 6b is a diagram of such a situation. If reference is made to the work by B. Laikhtman et al., Strained Quantum Well Valence-Band Structure and Optimal Parameters for AlGaAs-InGaAs-AlGaAs p-Channel Field-Effect Transistors, *J. Appl. Phys.*, Vol. 70, No; 3, p. 1531 (1991) or by I .J. Fritz et al., in Appl. Phys. Lett., Vol. 48, p. 1678 (1968), the $LH_1$ and $LH_2$ sub-bands move rapidly towards high energies with increasing concentration of indium in the layer 5 of $Ga_yIn_{1-y}As$. When the indium content exceeds 20%, $LH_1$ is at least about 150 mV from $HH_1$. For such a difference in energy position, the hole density in the $LH_1$ sub-band is less than a few hundredths of the hole density in the $HH_1$ sub-band. With 25% indium, the density ratio is no more than a few thousandths. Thus, if an indium content of more than 25% is chosen, the tunneling effect due to holes occupying the $LH_1$ and $LH_2$ sub-bands can be ignored.

We now consider the tunnel effect due to the holes occupying the $HH_1$, $HH_2$, . . . sub-bands and we compare them with the effect due to electrons in the n-channel transistor.

The effective mass $m^*_e$ of an electron in the n-channel is of the order of 0.07 $m_O$. For a given thickness of the layer 6 of $Al_xGa_{1-x}As$, the tunneling effect due to electrons is greater than that due to holes in sub-levels $HH_1$ and $HH_2$ which, it is recalled, have an effective mass $m^*_{hL}$ of the order of 0.4 $m_O$, as given by Equation (4). Equation (4) also shows that the tunneling probability is a function of the barrier width $\Delta E$, i.e. of $\Delta E_c$ (the conduction band discontinuity between $Al_xGa_{1-x}As$ of the layer 6 and $Ga_yIn_{1-y}$ As of the layer 5) for electrons and $\Delta E_v$ (the discontinuity in the valence band) for $HH_1$ and $HH_2$ holes.

If reference is made to the work of J. Batey et al., Energy Band Alignment in GaAs: (Al,Ga)As Heterostructures: The Dependence on Alloy Composition, *J. Appl. Phys.*, Vol. 59, No. 1, p. 200 (1986) and to the work of R .A. Kiehl et al., Parallel and Perpendicular Hole Transport in Heterostructures with high AlAs Mole-Fraction Barriers, *Appl. Phys. Lett.*, Vol. 58, No. 9, p. 954 (1991), it can be deduced for the alloy composition ranges under consideration herein, that the following barrier width values apply for an aluminum concentration $x_{Al} \approx 0.75$: $\Delta E_c = 800$ mV and $\Delta E_v = 520$ mV Equation (4) then shows that to obtain the same leakage current due to the tunneling effect, the p-channel transistor can tolerate a thickness $e_p$ of $Al_xGa_{1-x}As$ that is smaller than the thickness $e_n$ for the n-channel transistor, with said difference giving rise to a ratio $e_n/e_p = 1.25$.

We now consider the case where the quantum well is not symmetrical (the case described by Grider in the article mentioned above), and which corresponds to a structure in which the layers 4, 5, and 6 are respectively GaAs, $Ga_yIn_{1-y}As$, and $Al_xGa_{1-x}As$.

The valence band diagram for this structure is given in FIGS. 7a and 7b, respectively at rest and under a negative gate voltage. Two discontinuities can be seen in the valence band, namely $\Delta E_{v1}$ between the layer 6 of $Al_xGa_{1-x}As$ and the layer 5 of $Ga_yIn_{1-y}As$, and $\Delta E_{v2}$ between the layer 4 of GaAs and the layer 5 of $Ga_yIn_{1-y}As$. It may be observed that $\Delta E_{v2}$ is small, of the order of 100 mV, so that the $LH_1$ level is situated in the continuous spectrum. However, this situation changes rapidly under negative bias of the gate since, under such circumstances, a pseudo-triangular quantum well (FIG. 7b) is formed in this case and the $LH_1$ level appears in the well, in a manner that is comparable to the symmetrical quantum well in FIGS. 6a and 6b, which situation is described above.

The conclusions are thus essentially the same in both cases, and in particular that to obtain the same tunneling effect leakage current in both complementary transistors, the p-channel transistor must have a thickness of $Al_xGa_{1-x}As$ that is less than the thicknesses of the n-channel transistor, with the ratio of said thicknesses being of the order of 1.25.

We now consider the practical problem which consists in making p-channel transistors on the same substrate as n-channel transistors in spite of having a thinner layer 6 of $Al_xGa_{1-x}As$.

By way of example, if the layer 6 of $Al_xGa_{1-x}As$ of the n-channel transistor has a thickness $e_n = 25$ nm, then the thickness of the p-channel transistor should be $e_p = 20$ nm. Such layers are extremely thin and thickness control must be as accurate as possible in order to optimize the transconductances and the leakage currents of the transistors.

To this end, the invention proposes a method of manufacture that implies modifying the epitaxial structure of the layer 6 compared with the starting structure of FIG. 1.

FIG. 8 shows the novel epitaxial structure: on layers 1 to 5 made in the same manner as the layers in FIG. 1, the layer 6 of $Al_xGa_{1-x}As$ is replaced with a set of three successive layers comprising a first layer 15 of $Al_xGa_{1-x}As$ (having an aluminum content $x_{Al}$ of not less than 0.70) of thickness 20 nm, a layer 16 of GaAs that is about 1 nm thick, and finally a layer 17 of $Al_xGa_{1-x}As$ that is 5 nm thick. It will be observed that the sum of the thicknesses of the layers 15 and 17 (20 nm+5 nm) is equal to the thickness of the equivalent layer 6 in the FIG. 1 structure, i.e. 25 nm, and that the ratio of the total thickness (layer 15+layer 17) relative to the layer 15 on its own is equal to (20+5)/20=1.25, i.e. the above-mentioned predetermined thickness ratio. If the thickness of the layer 6 in the starting structure is not 25 nm, but has some other value, then the thicknesses of the layers 15 and 17 should be modified accordingly.

The n-channel transistor will make use of a gate deposited on the surface layer 7 of GaAs (as in FIG. 1), whereas the p-channel transistor will make use of a gate deposited on the layer 16 (and not on the layer 7).

To this end, special etching is performed that consists, after making a surface deposit of a layer of photosensitive resin 18, initially in opening a location 19 in said layer, at the bottom of which the gate G' of the p-channel transistor is to be deposited; this first etching operation is performed chemically, by ion milling, or with reactive ion etching, and it may continue in part into the layer 17 down to the level referenced 20 in FIG. 8. In the opening formed in this way, the layer 17 is then selectively dissolved so that etching comes to an end very accurately at the level of layer 16 (level referenced 21 in FIG. 8). This final selective etching may be simply performed chemically using dilute hydrofluoric or hydrochloric acid, which is known to have selectivity that exceeds $10^5$.

It is then possible to deposit metal to constitute the gate G', as shown in FIG. 9. The gate electrode G of the n-channel transistor (lefthand half of the figure) is deposited directly on the surface layer 7, while the gate electrode G' of the p-channel transistor (righthand half of the figure) is deposited on the deep layer 16 of GaAs at the bottom of the opening provided in the preceding step. The various drain and source electrodes D, D', S, S' are deposited on the surface layer 7.

Second Embodiment of the Invention

As mentioned above, the first embodiment of the invention serves to improve the transconductance of the p-channel transistor, but it has little effect on the threshold voltages $V_{Tn}$ and $V_{Tp}$. As also mentioned, these voltages have a considerable effect on the electrical power consumption of the circuit, so it is appropriate to further improve the structure of the invention by means of a technique that serves simultaneously to adjust the threshold voltages $V_{Tn}$ and $V_{Tp}$ independently and to increase the transconductance of the p-channel transistor.

The second embodiment of the present invention seeks to achieve this result.

The initial structure is similar to that of FIGS. 8 and 9. However, the thicknesses of the layers 15 and 17, and the doping 3 are chosen in such a manner as to reduce the threshold voltages of the transistors simultaneously to values below 0.55 V (for the threshold voltage of the p-channel transistor, it is the absolute value $|V_{Tp}|$ that is taken into account not the algebraic value $V_{Tp}$). To determine an order of magnitude, if the overall thickness of the layers 7, 15, 16, and 17 is 28 nm, and if the doping 3 is at $5\times10^{11}$ cm$^{-2}$, then the threshold voltage of the n-channel transistor will be about 0.45 V.

If the gate of the p-channel transistor is deposited on the layer 7 as is done conventionally in the prior art (see FIG. 1), then the threshold voltage $V_{Tp}$ of the p-channel transistor is of the order of −0.65 V, which is too large (in absolute value).

The structure of the invention makes it possible to deposit the gate of the p-channel transistor on the layer 16, possibly by using a technique described above with reference to the first embodiment of the invention. This gate is closer to the layer 5 than is the gate of the n-channel transistor. The threshold voltage $|V_{Tp}|$ of the p-channel transistor is thus reduced (in absolute value). By selecting an appropriate value of thickness for the layer 15, it is thus possible to adjust the threshold voltage $V_{Tp}$ of the p-channel transistor, with the doping 3 being predetermined as described above.

To determine an order of magnitude, with doping at $5\times10^{11}$ cm$^{-2}$, the thickness of the layer 15 must be of the order of about 15 nm to ensure that the threshold voltage $V_{Tp}$ is of the order of −0.45 V.

Relative to the overall thickness of the layers 7, 15, 16, and 17, which is equivalent to the thickness of the layers 6 and 7 in the prior art, the thickness of the layers 15 and 16 is smaller by a factor equal to about 1.7. Given that the transconductance of a HIGFET is proportional to the distance between its gate and the channel which constitutes the layer 5, the structure of the invention can therefore improve the transconductance of the p-channel transistor by a factor of 1.7.

As explained above, the effective masses of holes in the transverse direction are greater than the effective masses of electrons, such that the gate-channel distance of the p-channel transistor can be reduced without the gate leakage current due to the tunnel effect becoming too high. In this approach, a reduction in thickness by a factor of about 1.25 has been observed. However this factor may be greater than that. In the first embodiment of the invention described above, it is assumed that the gate leakage current of the n-channel transistor is due to the current tunneling through the potential barrier defined by $\Delta E_c$, with the Γ conduction band being taken as the band that determines the tunnel effect. However, under certain conditions, in particular when the thickness of the barrier is greater than about 10 nanometers, the tunnel effect is assisted by the X band. Under such circumstances, above $x_{Al}=0.45$, the width of the barrier $\Delta E_c$ varies slightly with aluminum concentration: between $x_{Al}=$ 0.45 and $x_{Al}=1$, $\Delta E_c$ varies from about 500 meV to about 550 meV. By using the same calculations as those explained above for the first embodiment of the invention, it is found that the thickness of the layer 15 can be reduced by a factor of 2 relative to the thickness of the layer 17.

Returning to the example given above, the layer 15 thus has a thickness of 12.5 nm, which suffices for bringing the threshold voltage $V_{Tp}$ to about −0.43 V.

In accordance with the invention, a further improvement can be provided to the stack of layers 15 and 17 that enables the leakage current of the p-channel transistor gate to be reduced while still further reducing the thickness of the set of layers 15 and 16. The gate leakage current of the p-channel transistor depends mainly on two parameters that relate to the material of the layer 15: its thickness and its composition, which parameters define the height of the potential barrier $\Delta E_v$, i.e. the valence band discontinuity between the material $Ga_yIn_{1-y}As$ of layer 5 and the material of layer 15. Heretofore, the material of layer 15 has been chosen to be identical with that of layer 17, i.e. $Al_xGa_{1-x}As$ with $x_{Al}$ close to 0.75. However it is much more advantageous to increase the concentration $x_{Al}$ of the layer 15 in order to increase the width of the potential barrier $\Delta E_c$, thereby reducing the gate leakage current. It is quite possible to envisage increasing $x_{Al}$ up to 1, in other words having a layer 15 that is made of AlAs. Calculations based on the effect of holes tunneling through the potential barrier $\Delta E_v$ show that increasing $x_{Al}$ from 0.75 to 1 makes it possible to reduce the gate leakage current by a factor of about 6. Given that tunneling probability is given by above-specified Equation (4), it is easy to deduce that increasing $\Delta E_v$ makes it possible to reduce d (the thickness of layer 15) while keeping the same tunnel probability, i.e. the same leakage current. Increasing $x_{Al}$ from 0.75 to 1 thus makes it possible to reduce the thickness d of the layer 15 by a factor of about 1.4.

Thus, starting from a nominal thickness of 28 nm for the set of layers 7, 15, 16, and 17, it is possible to apply successive thickness reductions by a factor 2 due to the difference in effective masses of holes and electrons, and then by a factor of 1.4 due to the use of AlAs instead of $Al_xGa_{1-x}As$. The total improvement is thus by a factor of $2\times 1.4=2.8$, thereby enabling a thickness of the layer 15 to be reduced to 9 nm. The threshold voltage $|V_{Tp}|$ will thus decrease by about 0.05 V, bringing it down to 0.37 V. This reduction in the threshold voltage is accompanied by an increase in transconductance by a factor of about 2.8.

So far, $5\times 10^{11}$ cm$^{-2}$ has been taken as an example of the value for the doping 3, but it will be understood that the effects of reducing the threshold voltage and of increasing the transconductance as explained above are equally applicable to doping at other values. Thus, the doping 3 need not necessarily be performed uniformly, but may be performed by implanting electron donor impurities locally in the channels of n-type transistors, while avoiding any intentional doping of p-channel transistors.

Doing this makes it possible to further reduce the threshold voltage $|V_{Tp}|$ of the p-channel transistor down to a value close to 0.10 V to 0.15 V. By adjusting the localized doping of n-channel transistors, it is also possible to adjust the voltage $V_{Tn}$ to similar values. Complementary transistors are thus obtained, both of which operate at very low threshold voltages, which constitutes an improvement over the results published by G. S. LaRue and D. E. Grider in Complementary HFET 32-Bit Serial Multiplier, *GaAs IC Symposium 1992 Digest*, p. 89, where the p-channel transistor had its threshold voltage fixed at −0.34 V. The other advantage is clearly the improvement in the transconductance of the p-channel transistor.

In an even more elaborate technique, it is also possible to adjust the threshold voltages of the n-channel and the p-channel transistors independently by implanting impurities in localized manner both in the channels of n-channel transistors and in the channels of p-channel transistors, by choosing different implanting concentrations for the two types of transistor or by implanting electron donor impurities in the n-channel transistors while implanting hole donor impurities (also known as acceptors) in the p-channel transistors.

Until now, attempts have been made to optimize the composition of the layer 15 without worrying about technological problems relating to the manufacture of transistors.

Unfortunately, it is known that an aluminum-rich $Al_xGa_{1-x}As$ alloy, and thus a fortiori an alloy of AlAs, gives rise to difficulties in implementing the source and drain ohmic contacts, thus having the effect of creating high access resistances that hinder good operation of the transistors, and more particularly of n-channel transistors (see for example the above-specified article by A. I. Akiwande et al.).

To prevent the highly aluminum-rich layer 15 degrading access resistances to the n-channel transistor, it is possible to reduce the aluminum concentration in the layer 17 so that the mean concentration of the layers 15+17 remains equal to 0.75, which implies that the aluminum concentration in the layer 17 should have a value of about 0.5 to about 0.6. A. I. Akiwande et al. have shown in the above-mentioned article that the gate leakage current of the n-channel transistor does not improve much beyond a concentration of 0.6, thus making it possible to have a good compromise between low gate leakage current and ease of implementing ohmic contacts.

In this context of facilitating implementation of ohmic contacts by using materials having low aluminum content, it is possible to replace the $Al_xGa_{1-x}As$ of the layers 15 and 17 with $Al_uIn_{1-u}P$ (with $u_{Al}\approx 0.4$) or with $(Al_xGa_{1-x})_uIn_{1-u}P$ in which the concentration $x_{Al}$ is close to 1, thereby increasing the heights of the potential barriers $\Delta E_c$ and $\Delta E_v$. According to S. Tiwari and D. F. Frank in Empirical Fit to Band Discontinuities and Barrier Height in III–V Alloy Systems, *Applied Physics Letters*, 60, No. 3, 630 (1992), the compound $Al_uIn_{1-u}P$ has potential barriers $\Delta E_c$ and $\Delta E_v$ of widths greater than those of AlAs. From this point of view it is therefore more favorable than $Al_xGa_{1-x}As$.

According to the invention, it is possible in even more general manner to adopt III–V semiconductor materials of entirely different compositions for the layers 15, 16, 17, and 7 in order to give each of them its own particular properties.

A first example concerns the layer 7 and/or the layer 16. Until now, this has been of GaAs material which provides a protective function against oxidation at the surface of the $Al_xGa_{1-x}As$. As explained above with respect to the first embodiment of the invention, it also acts as a selectivity agent for chemical etching, thus facilitating the method of manufacturing the integrated circuit.

However, its role in reducing the gate leakage current due to the tunnel effect is zero. Worse, its presence increases the thickness of the set of layers and thus it increases the threshold voltage and decreases the transconductance. When layers are used that are about 25 nm thick, an excess of thickness of 3 nm due to the layer 7 may in the limit, be considered as negligible, however, when the thickness is reduced to 10 nm as explained above for the layer 15, a value of 3 nm is no longer negligible. Under such circumstances, it is desirable to use a III–V semiconductor material having a wider forbidden band that is not subject to excessive surface oxidation and that has a lattice constant that matches that of the substrate or that has only a small mismatch therewith. A small mismatch in the lattice constant of the layer 16 relative to the substrate may be in compression or in extension. If it is compression, then the mechanical tension adds to that of the layer 5, and it is necessary for the set of mechanical tensions in the layers 5 and 16 not to exceed a critical value, since otherwise dislocations will appear at the interfaces. One such wide forbidden band material is AlGaAs with a low aluminum content. However it is advantageous to use a material that does not contain an easily oxidized element such as aluminum. $Ga_uIn_{1-u}P$ ($u_{Ga}=0.49$) may be such a material, which also has the advantage of presenting a wide potential barrier $\Delta E_v$, relative to III–V compounds based on arsenic (see, for example, the above-mentioned article by S. Tiwari and D. J. Frank, or else an article by J. O. McCaldin and T. C. Gill, Comment on Empirical Fit to Band Discontinuities and Barrier Heights in III–V Alloy Systems, *Applied Physics Letters*, 61, No. 18, 2243 (1992)).

In addition, $Ga_uIn_{1-u}P$ also has the advantage of a low rate of chemical etching by the dilute acids used for digging into the layer 15, as described above with respect to the first embodiment of the invention.

Remaining in the context of choosing different materials, two different materials may be considered for use in the layers 15 and 17 in order to optimize the main parameters that determine the threshold voltage and the gate leakage current in a manner that is separate for p-channel transistors and for n-channel transistors.

Consider initially the leakage current parameter. It is recalled that it depends on the heights of the potential barriers $\Delta E_c$ and $\Delta E_v$. If the layers 15 and 17 are of the same kind, then $\Delta E_c$ and $\Delta E_v$ are related by the equation $\Delta E_c +$ $\Delta E_v = \Delta E_g$, where $\Delta E_g$ designates the difference between the forbidden band energies of the material in layers 15 and 17 and the material in layer 5.

If different materials are selected for the layers 15 and 17, a target can be established to find a material having wide $\Delta E_v$ for the layer 15 and a material having wide $\Delta E_c$ for the layer 17.

Thus, for expitaxial growth on a GaAs substrate, the material for the layer 15 may be AlAs or $Al_uIn_{1-u}P$ ($u_{Af} \approx 0.49$) which have a wide $\Delta E_v$ barrier, while the material for the layer 17 may be $GaP_sSb_{1-s}$ ($s_f \approx 0.65$) which has a wider $\Delta E_c$ barrier than AlAs or $Al_uIn_{1-u}P$ (whereas its $\Delta E_v$ barrier is very narrow, being close to zero; see for example FIG. 1 of the above-mentioned article by S. Tiwari and D. J. Frank).

For epitaxial growth on InP, the layer 5 which is under mechanical strain, may be $Ga_yIn_{1-y}As$ with $Y_{Ga}$ being of the order of 0.12 to 0.27, whereas the material having a wide forbidden band and matching the lattice constant of the substrate may be InP, $Al_zIn_{1-z}As$ ($z_{Af} \approx 0.4$), or else $GaP_sSb_{1-s'}$ (with $s'_f \approx 0.35$). However, in that system, it is clear that $Al_zIn_{1-z}As$ has a $\Delta E_v$ barrier that is not wide enough (about 250 meV) to be effective. In contrast its $\Delta E_c$ barrier of about 500 meV is acceptable. Conversely, InP has a $\Delta E_v$ width of about 500 meV and a $\Delta E_c$ width of about 250 meV. It is thus quite appropriate to use InP for the layer 15 and $Al_zIn_{1-z}As$ for the layer 17. With respect to the alloy $GaP_sSb_{1-s'}$ ($s'_f \approx 0.35$), the discontinuity of the valence band $\Delta E_v$ is negative, so that there is no potential barrier. This compound therefore cannot be used in the layer 15. When used in the layer 17, it presents a $\Delta E_c$ barrier of about 800 meV to electrons, which is very favorable.

The use of layers 15 and 17 of different kinds has an additional advantage of selectivity in chemical etching that makes it possible to remove the layer 15 without digging into the layer 17. In this case, the intermediate layer 16 becomes superfluous, thus making it possible to further reduce the absolute value of the threshold voltage $|V_{Tp}|$ and to increase the transconductance of the p-channel transistor. In the example mentioned above where the layer 15 is reduced to 10 nm, if the 3 nm layer 16 is removed, transconductance is improved by 30% and $V_{Tp}$ is improved by 0.03 V, i.e. by about 10%.

In addition, by using different materials for the layers 15 and 17 so as to increase the values of $\Delta E_c$ and $\Delta E_v$, it is tempting to believe that in the light of equation (1) the threshold voltages $V_{Tn}$ and $|V_{Tp}|$ will increase pro rata the increases in $\Delta E_c$ and $\Delta E_v$. Unfortunately, $\Phi_{Bn}$ and $\Phi_{Bp}$ are magnitudes that also depend on the materials used. From FIG. 1 in the above-mentioned article by S. Tiwari and D. J. Frank, it is clear that the differences ($\Phi_{Bn} - \Delta E_c$) and ($-\Phi_{Bn} + \Delta E_v$) are zero to a first approximation.

In addition, all of these considerations concerning threshold voltage, transconductance, or gate leakage current have little connection with the quantum phenomena already described in related French patent applications 92-00668 and 92-08985 in the name of the Applicant. The thickness of the layer 5 can thus have a value that is close to 6 nm to 8 nm, and between the layer 5 and the buffer layer 2, it may optionally be possible to interpose a layer 22 (FIG. 9) presenting relative to the layer 5 a valence band discontinuity of about 100 meV or more, so as to provide better separation between the $HH_3$ sub-band and the other sub-bands $HH_1$ and $HH_2$.

I claim:

1. An integrated circuit having complementary components of the p-channel and n-channel field effect transistor type, with a heterojunction formed between a barrier layer comprising a III–V semiconductor material having a wide forbidden band and a thin layer comprising a III–V semiconductor material having a narrow forbidden band and whose crystal lattice mismatch with the remainder of the structure is such that the thin layer is under uniaxial compression strain in the plane of the layer, wherein the barrier-layer thickness for the p-channel transistor is less than the barrier-layer thickness for the n-channel transistor at a ratio that is proportional to tunneling probability for holes compared with that for electrons through the barrier layer, in a direction perpendicular to the plane of the barrier layer and thin layer interface.

2. The integrated circuit of claim 1 wherein the heterojunction defines a quantum well including heavy hole, HH, and light hole, LH, type sub-bands in the valance-band diagram of the heterostructure in the level that comprises the narrow forbidden band, and wherein the material comprising the narrow forbidden band effects energy differences among the sub-bands $HH_1$, $HH_2$ and $LH_1$, such that the $LH_1$ sub-band population is, essentially, negligible, and the n-channel transistor gate-leakage current is, essentially, independent of tunneling probability for heavy holes $HH_1$ and $HH_2$.

3. The integrated circuit of claim 1 wherein the thickness ratio of the layer reduces the absolute values of threshold voltages of said transistors, thereby reducing the electrical power consumption of the circuit while increasing the transconductance of the p-channel transistor.

4. The integrated circuit of claim 1, in which the wide forbidden band material is AlGaAs and the narrow forbidden band material is GaInAs, said materials being grown epitaxially on a substrate of GaAs.

5. The integrated circuit of claim 1, in which the wide forbidden band material is (AlGa)InP and the narrow forbidden band material is GaInAs, said materials being grown epitaxially on a substrate of GaAs.

6. The integrated circuit of claim 1, in which the wide forbidden band material is AlInAs and the narrow forbidden band material is GaInAs, said materials being grown epitaxially on a substrate of InP.

7. The integrated circuit of claim 1, in which the wide forbidden band material is InP and the narrow forbidden band material is GaInAs, said materials being grown epitaxially on a substrate of InP.

8. The integrated circuit of claim 1, in which:
   the barrier layer includes an epitaxial stack comprising:
     a first elementary layer comprising the wide forbidden band material;,
     a second elementary layer different in composition from the first elementary layer, and suitable for facilitating selective etching thereof; and
     a third elementary layer comprising the wide forbidden band material;
   the ratio of the thickness of the first elementary layer to the total thickness of the first and third elementary layers is equal to said tunneling probability ratio; and
   gate G' of the p-channel transistor is disposed to contact the second elementary layer.

9. The integrated circuit of claim 3, in which:
   the barrier layer includes an epitaxial stack comprising:
     a first elementary layer comprising the wide forbidden band material;
     a second elementary layer different in composition from the first elementary layer, and suitable for facilitating selective etching thereof; and a third elementary layer comprising the wide forbidden band material;

the ratio of the thickness of the first elementary layer to the total thickness of the first and third elementary layers is equal to said tunneling probability ratio; and gate G' of the p-channel transistor is disposed to contact the second elementary layer, in which the threshold voltages of the transistors, in absolute terms, are less than 0.5 V.

10. The integrated circuit of claim 9, in which the transconductance of the p-channel transistor is increased by a factor of more than 1.25 relative to that of a p-channel transistor having its gate deposited on the barrier layer.

11. The integrated circuit of claim 8, in which the composition of the first elementary layer (a) effects a potential barrier $\Delta E_v$ corresponding to the discontinuity in the valence band between the first elementary layer and the thin layer, (b) determines the tunneling probability for holes, (c) is independent of the potential barrier $\Delta E_c$ corresponding to the conduction band discontinuity between the material of the third elementary layer and of the thin layer, and (d) determines tunneling probability for electrons, thereby reducing the thickness of the first elementary layer and consequently reducing the threshold voltages of the transistors to values of less than about 0.4 v, and increasing the transconductance of the p-channel transistor, relative to an integrated circuit where the first and third elementary layers are identical.

12. The integrated circuit of claim 11, in which the first elementary layer comprises AlAs and the third elementary layer comprises $Al_xGa_{1-x}As$, wherein $0.5 \leq x \leq 0.75$, epitaxially grown on a GaAS substrate.

13. The integrated circuit of claim 11, in which the first elementary layer comprises AlAs and the third elementary layer comprises $Al_uIn_{1-u}P$, wherein $u \approx 0.50$, epitaxially grown on a GaAs substrate.

14. The integrated circuit of claim 11, in which the first elementary layer comprises $Al_uIn_{1-u}P$, wherein $u \approx 0.50$, and the third elementary layer comprises $Al_xGa_{1-x}As$, wherein $0.5 \leq x \leq 0.75$, epitaxially grown on a GaAs substrate.

15. The integrated circuit of claim 11, in which the first elementary layer comprises $Al_uIn_{1-u}P$, wherein $u \approx 0.50$, and the third elementary layer comprises $GaP_sSb_{1-s}$, wherein $s \approx 0.65$, epitaxially grown on a GaAs substrate.

16. The integrated circuit of claim 16, in which the first elementary layer comprises InP and the third elementary layer comprises $Al_zIn_{1-z}As$, wherein $z \approx 0.48$, epitaxially grown on a InP substrate.

17. The integrated circuit of claim 11, in which the first elementary layer comprises InP and the third elementary layer comprises $GaP_{s'}Sb_{1-s'}$, wherein $s' \approx 0.35$, epitaxially grown on a InP substrate.

18. The integrated circuit of claim 15, in which:

the barrier layer includes an epitaxial stack comprising:

a first elementary layer comprising the wide forbidden band material; and a second elementary layer comprising the wide forbidden band material;

a third elementary layer comprising the wide forbidden band material;

the ratio of the thickness of the first elementary layer to the total thickness of the first and third elementary layers is equal to said tunneling probability ratio; and gate G' of the p-channel transistor is disposed to contact the second elementary layer;

wherein-selective etching of the first elementary layer is effected by the first elementary layer having a different composition than the third elementary layer.

19. The integrated circuit of claim 1, wherein the n-channel transistor includes a doping material.

20. The integrated circuit of claim 19, wherein the p-channel transistor includes no doping material.

21. The integrated circuit of claim 19, wherein the p-channel transistor includes a doping material at a concentration different from the concentration of the doping material in the n-channel transistor.

22. The integrated circuit of claim 1, further comprising a separation layer interposed between a buffer layer and the thin layer, presenting, relative to the thin layer, a valence band discontinuity that is not less than about 100 meV.

* * * * *